United States Patent
Anderson et al.

(10) Patent No.: US 6,194,246 B1
(45) Date of Patent: Feb. 27, 2001

(54) PROCESS FOR FABRICATING ELECTRONIC DEVICES HAVING A THERMALLY CONDUCTIVE SUBSTRATE

(75) Inventors: David Joseph Anderson, Oak Lawn; John Thomas Meagher, Hawthorn Woods, both of IL (US)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/382,943

(22) Filed: Aug. 25, 1999

(51) Int. Cl.[7] .......................... H01L 21/44; H01L 21/48; H01L 21/50
(52) U.S. Cl. .......................... 438/106; 438/121; 438/123
(58) Field of Search .................................... 438/106, 121, 438/123

(56) References Cited

U.S. PATENT DOCUMENTS

| | | | |
|---|---|---|---|
| 4,413,766 | 11/1983 | Webster | 228/123 |
| 4,500,029 | 2/1985 | Yerman | 228/123 |
| 4,538,170 | 8/1985 | Yerman | 357/80 |
| 4,809,135 | 2/1989 | Yerman | 361/404 |
| 5,418,002 | 5/1995 | Paik et al. | 427/96 |
| 5,708,566 | 1/1998 | Hunninghaus | 361/764 |
| 5,834,334 | * 11/1998 | Leedy . | |
| 5,899,705 | * 5/1999 | Akram . | |

OTHER PUBLICATIONS

Thermal Spray Technologies, Inc. "Engineering Surfaces For the Twenty–First Century and Surface Coatings For Tomorrow's Technologies" (4 pages).

* cited by examiner

Primary Examiner—Kevin M. Picardat
Assistant Examiner—D. M. Collins
(74) Attorney, Agent, or Firm—Gary J. Cunningham

(57) ABSTRACT

A process for fabricating an electronic module (30) and a packaged electronic device (56) having a thermally conductive substrate includes the step of thermally spraying of a dielectric layer (12) onto a baseplate (10). An electrically conductive layer (18) is then direct bonded to the thermally sprayed dielectric layer. The thermally sprayed dielectric layer can be formed at selected locations on the upper surface of the baseplate (10) by forming a pattern on the upper surface prior to carrying out the thermal spraying process. The electrically conductive layer (18) is patterned to form an interconnect pattern overlying the baseplate. Because the thermal spraying process can form extremely thin dielectric layers, an electronic module (30) fabricated in accordance with the invention exhibits high heat transfer characteristics. A heat producing electronic component (24), such as a power transistor, can be attached to the electrically conductive layer (18), and the heat generated therefrom dissipated through the baseplate (10).

27 Claims, 3 Drawing Sheets

PROCESS FOR FABRICATING ELECTRONIC DEVICES HAVING A THERMALLY CONDUCTIVE SUBSTRATE

FIELD OF THE INVENTION

This invention relates, in general, to electronic devices containing electronic components capable of generating large quantities of heat, and more particularly, to a process for fabricating an electronic device that includes a thermally conductive substrate.

BACKGROUND OF THE INVENTION

Electronic modules used in automotive applications often employ electronic components mounted to a printed circuit board. The electronic components are typically soldered to the printed circuit boards and electrically coupled to metal traces overlying the surface of the printed circuit board. Typically, for automotive control applications, several large power transistors are mounted to the printed circuit board. To reduce product cost, it is desirable to utilize standard packaged devices, such as the TO-220 device, in electronic modules intended for automotive control applications. For example, in automotive applications, such as an ignition control system, the TO-220 power transistors are typically used as ignition coil drivers. The TO-220 devices are capable of generating large quantities of heat during normal operation. To keep the temperature of the power transistors from rising to a destructive level, heat-dissipating structures are generally employed to conduct the heat away from the transistors.

In heat dissipation techniques of the prior art, the printed circuit board is adhesively bonded to a metal, baseplate. The baseplate generally has high thermal conductivity and is the primary thermoradiator to the ambient environment. To effectively transfer the heat from electronic components mounted on the printed circuit board to the baseplate, the total thermal resistance between the electronic components and the baseplate must be minimized. The adhesive bonding layer is typically an organic polymer that provides the primary attachment of the printed circuit board to the baseplate. However, the adhesive bonding layer accounts for the majority of the thermal resistance between the electronic components and the baseplate. This problem is compounded by the use of plastic packaging encasing the electronic components. The plastic packaging adds an additional layer of thermal resistance between the baseplate and the electronic component.

Often, electronic modules are required to function in a high temperature ambient environment. In this embodiment, large amounts of power must be dissipated from the electronic devices within the electronic module. The commonly used thick ceramic substrates are soldered to the baseplate during fabrication of the electronic module. In addition to high cost, these substrates do not offer exceptional thermal performance, nor do they permit multilayer substrate configurations to be fabricated. Also, the module fabrication process requires numerous processing steps.

Accordingly, further development of module fabrication technology is necessary to improve the temperature control, and to provide a low-cost improved configuration of electronic modules containing heat-generating electronic components.

Figure 1:
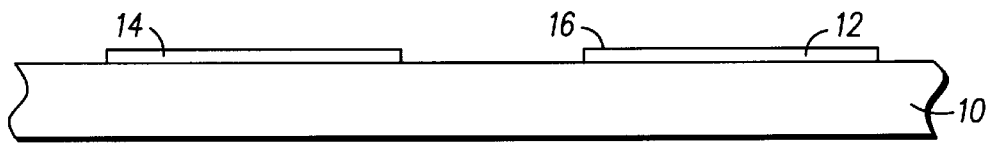
FIGS. 1–3 illustrate, in cross-section, processing steps for the fabrication of a thermally conductive substrate in accordance with one embodiment of the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

The present invention is for a process for fabricating an electronic device that includes a thermally conductive substrate. The thermally conductive substrate is fabricated by thermally spraying a dielectric layer followed by direct bonding an electrically conductive layer to the dielectric layer. By thermally spraying the dielectric layer onto a substrate, an extremely thin, dielectric layer is formed overlying a thermally conductive baseplate. In accordance with the invention, the thin, thermally sprayed dielectric layer provides minimal thermal resistance between the thermally conductive baseplate and the overlying electrically conductive layer. In accordance with the invention, a bare silicon electronic component can be attached to the overlying electrically conductive layer, and the heat generated by the electronic component can be dissipated through the thin dielectric layer to the thermally conductive baseplate. In addition to providing improved thermal conductivity, the thermally conductive substrate and electronic module fabricated in accordance with the invention can be produced at low cost compared with substrates and modules of the prior art.

In another embodiment of the invention, first and second electrically conductive layers are direct bonded onto the substrate to provide electrical interconnects to the electronic component. By providing multiple, direct-bonded, electrically conductive layers, a low cost method is realized for fabricating the power section of an electronic module. Additionally, the first and second direct bonded electrically conductive layers can be arranged to provide low impedance within an electronic control module.

Shown in FIG. 1, in cross-section, is a portion of a thermally conductive baseplate 10. Preferably, baseplate 10 is a metal plate composed of copper or a copper alloy. Baseplate 10 can also be a steel alloy or a nickel-iron alloy. The steel and nickel-iron alloys are thermally conductive alloys that are stable at high temperatures. Alternatively, baseplate 10 can be another metal having a low coefficient of thermal expansion and stable at high temperatures. Baseplate 10 can also be a multilayer laminate including first and second copper layers having a steel or nickel-iron alloy layer between the copper layers. Additionally, baseplate 10 can be a multilayer laminate including first and second copper layers and a molybdenum layer between the copper layers.

In accordance with the invention, a thin dielectric layer 12 is thermally sprayed onto baseplate 10. Dielectric layer 12 can be a material, such as metal oxides, metal nitrides, diamond, non-electrically conductive carbon and mixtures thereof in any combination. Preferably, dielectric layer 12 is a composite dielectric layer containing boron nitride (BN) and alumina ($Al_2O_3$), or boron nitride and a mixture of alumina and titania ($TiO_2$). Alternatively, dielectric layer 12 can be aluminum nitride (AlN) and alumina or aluminum nitride and a mixture of alumina and titania. In yet another alternative embodiment, dielectric layer 12 can be another dielectric layer that is thermally conductive and exhibits high electrical resistivity. For example, dielectric layer 12 can be a material, such as industrial diamond, non-electrically conductive carbon, and the like. Ideally, the dielectric material should have a thermal conductivity of at least about 3.0 Watts per meter per ° C. The thermal spraying process can be any of several kinds of thermal spraying process, such as plasma spraying, high velocity oxygen fuel spraying, and the like.

In order to improve the adhesion of the plasma sprayed dielectric material, the baseplate can be roughened using a grit blasting process. During the plasma spraying process, partially melted particles are projected toward the surface of the baseplate. By increasing the roughness of the surface, the adhesion of the partially melted particles can be improved.

Dielectric layer 12 is preferably formed in sections on baseplate 10 by using a patterning process. For example, where a relatively simple geometric pattern is to be formed, a stencil (not shown) can be placed over baseplate 10 prior to carrying out the thermal-spraying process. Sections of dielectric material are formed by thermally spraying the dielectric material through openings in the stencil. Where a more complex geometric pattern is to be formed, a masking layer (not shown) can be applied to baseplate 10 and developed to form a pattern. The dielectric material is then thermally sprayed onto the baseplate 10, and the mask is subsequently removed to leave a dielectric pattern overlying the baseplate. Two sections 14 and 16 of the dielectric pattern are illustrated in FIG. 1.

Figure 2:
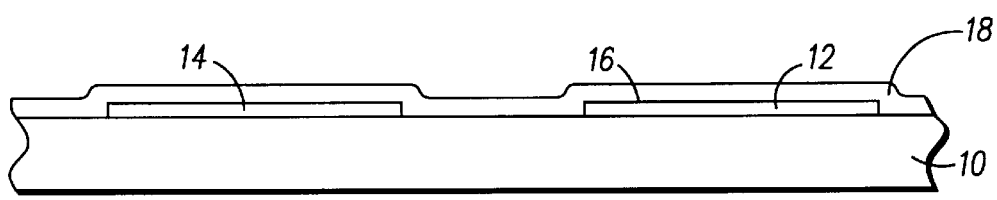

After forming dielectric layer sections 14 and 16, an electrically conductive layer 18 is formed to overlie baseplate 10 and sections 14 and 16, and illustrated in FIG. 2. Preferably, electrically conductive layer 18 is formed by a direct bonding process. The direct-bonding of metals to substrates, such as ceramics or metals, is well known in the art. A bonding agent is formed to provide chemical bonding. To form the bond, the metal and the substrate are placed adjacent to each other and the substrate and metal layer are heated for a sufficient amount of time, such that, upon cooling, a metal/metal-oxide bond forms. Preferably, the heating process is carried out in a controlled gas composition atmosphere. For example, the gas composition can be a mixture of oxygen and an inert gas.

In a preferred embodiment of the invention, a copper foil is placed over baseplate 10 and direct bonded to the baseplate and to first and second dielectric sections 12 and 14. Preferably, the copper foil includes copper oxide (CuO) that melts during the heating process and fuses to dielectric sections 14 and 16. Although the preferred electrically conductive layer is copper, other electrically conductive materials, such as metals that have oxides that melt at a lower temperature than the metal can also be used. Preferably, where electrically conductive layer 18 is copper, the direct bonding process employs a copper foil having a thickness of preferably about 4 to about 20 mils, and more preferably, about 12 mils.

Figure 3:

After direct bonding electrically conductive layer 18, a lithographic patterning and etching process is carried out to form drain contacts 20 and 22, as illustrated in FIG. 3. A variety of etching processes can be used to etch electrically conductive layer 18. The etching process can be either a wet chemical etch, or a dry plasma etch. Where electrically conductive layer 18 is copper, a wet etch can be carried out using an acid, base, or metal salt solution. Where a dry plasma etching process is carried out to form copper drain contacts 20 and 22, chlorine etching chemistry can be used to anisotropically etch electrically conductive layer 18. Once the electrically conductive layer is etched, a protective layer, such as electrolytic tin/lead plating, can be formed over drain contacts 20 and 22.

In an alternative embodiment, a net-shaped copper foil can be directly bonded to the dielectric layer and to the baseplate. The copper foil is formed into a desired pattern by, for example, a stamping process, prior to bonding to the baseplate and to the dielectric layer.

Figure 4:
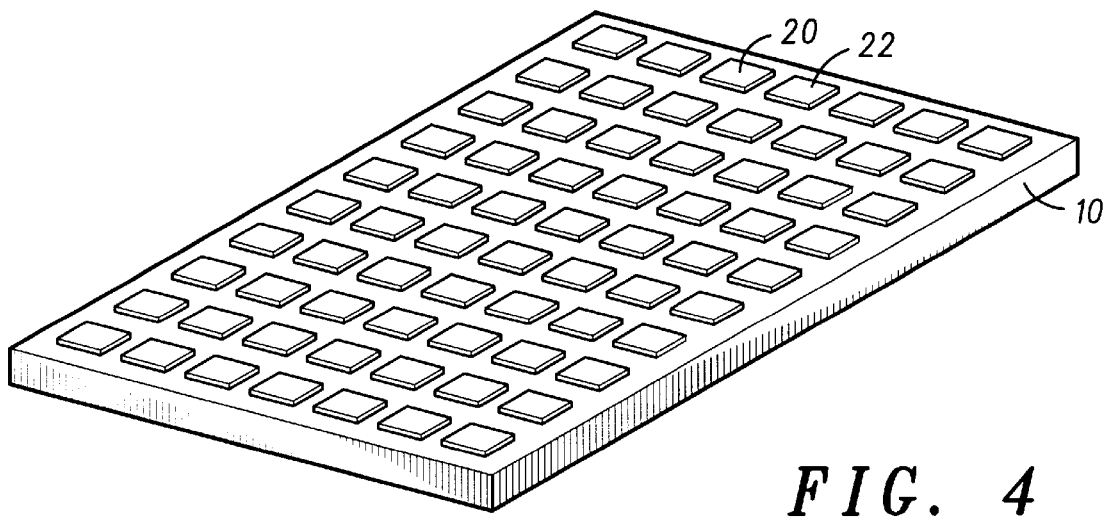
FIG. 4 illustrates, in perspective view, a substrate having an etched copper foil formed in accordance with the invention.

In accordance with the invention, a large number of drain contacts can be formed on a single section of baseplate material. As illustrated in FIG. 4, the etching process can form numerous drain contacts on the surface of baseplate 10. For example, drain contacts 20 and 22 are shown overlying a particular portion of baseplate 10. However, drain contacts 20 and 22 can be any of the plurality of such contacts illustrated in FIG. 4.

Once the drain contacts are formed, baseplate 10 can be sectioned into smaller portions, where each portion includes one or more drain contacts. Preferably, a punch-and-die set is used to singulate baseplate 10 into a plurality of smaller sections.

Figure 5:
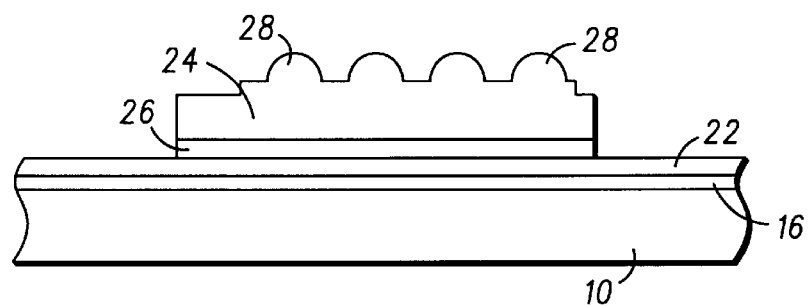
FIG. 5 illustrates, in cross-section, a bare silicon electronic component mounted to a thermally conductive substrate formed in accordance with the invention.

Shown in FIG. 5, in cross-section, is a singulated section of baseplate 10. The singulated portion of baseplate 10 support dielectric section 16 and drain contact 22. A bare silicon electronic component 24 is bonded to drain contact 22 by an electrically and thermally-conductive bond 26. Preferably, bond 26 is a solder joint. Electronic component 24 is preferably solder-bonded to drain contact 22 to form an electrically-conductive and thermally-conductive bond to drain contact 22. In accordance with the invention, heat generated by electronic component 24 is dissipated through bond 26, drain contact 22, and dielectric section 16 to baseplate 10. Because dielectric section 16 is formed by thermally spraying a dielectric material having a high thermal conductivity and a thickness of only about 1 to about 20 mils, dielectric section 16 does not present a substantial barrier to the dissipation of heat from electronic component 24.

After bonding electronic component 24 to drain contact 22, subsequent processing steps can be carried out to form electrical contacts (not shown) to the upper surface of electronic component 24. A number of contact bumps 28 are arrayed on the upper surface of electronic component 24. The bumps are formed using conventional processing technology known in the art as controlled-collapse-chip-connection ($C^4$). Contact bumps 28 provide locations upon which electrical contact to electronic component 24 can be readily formed.

Those skilled in the art will appreciate that the structure illustrated in FIG. 5 can be used in a variety of electronic modules that are intended for use in numerous applications. For example, the structure illustrated in FIG. 5 can form a portion of an electronic control module for steering systems, braking systems, and the like. Motor-driven systems require large electrical power loads to perform the various functions required in automotive applications. The ability to rapidly dissipate heat generated by electronic components, such as TO-220 power transistors, and the like, can enable fabrication of electronic control modules that demonstrate improved reliability. Additionally, the rapid heat dissipation provided by substrates fabricated in accordance with the invention permit the fabrication of modules having expanded capacity. For example, multiple heat-generating electronic components can be included in a single module.

Figure 6:
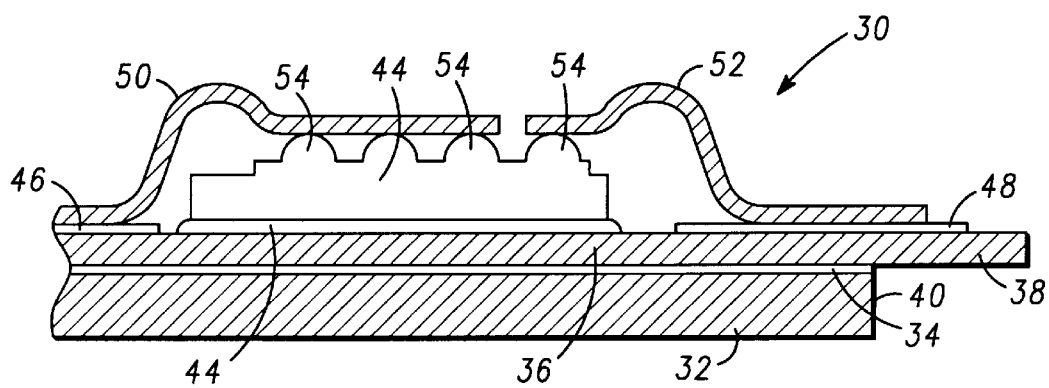
FIG. 6 illustrates, in cross-section, a bare silicon device component mounted to a thermally conductive substrate that includes first and second direct-bonded-copper layers formed in accordance with the invention for electrically interconnecting the device component.

Another embodiment of the invention is illustrated, in cross-section, in FIG. 6. A portion of an electronic control module 30 includes a baseplate 32 having a plasma-sprayed dielectric layer 34 thereon. A drain connection 36 overlies dielectric layer 34. A tab extension 38 protrudes beyond an edge 40 of baseplate 32. Preferably, drain connection 36 is a direct bond copper foil having a thickness of about 4 to about 20 mils, and more preferably having a thickness of about 12 mils. An electronic module 42 overlies drain connection 36 and is bonded thereto by a bond 44.

In accordance with the invention, a second plasma-sprayed dielectric layer is selectively formed on drain connection 36. The second plasma-sprayed dielectric layer is formed to have a first portion 46 and a second portion 48 overlying drain connection 36. Electrical interconnects 50 and 52 overlie drain connection 36 and are separated therefrom by first and second dielectric portions 46 and 48. Preferably, electrical interconnects 50 and 52 are formed by a direct-bond-copper foil having a thickness similar to that of drain connection 36.

Electrical interconnect 50 contacts selected ones of contact bumps 54 arrayed on the upper surface of electronic component 42. Additionally, electrical interconnect 52 contacts other selected ones of contact bumps 54. Electronic control module 30 can be a multi-chip module for a motor control of an automotive subsystem, and the like. Tab extension 38 provides a side for welding the drain contact to external electrical circuitry arranged within the module package (not shown).

Electronic module 30 can be employed in high current applications that operate at high voltage. For example, electronic control module 30 can operate at a voltage of about 42 Volts and an electrical current load of about 100 Amps.

Electronic control module 30 is assembled by a process substantially similar to that described above. Dielectric layer 34 is preferably a thermally sprayed composite layer of boron nitride and alumina, or boron nitride and a mixture of alumina and titania. As in the previous embodiment, dielectric layer 34 can be aluminum nitride and alumina, or aluminum nitride and a mixture of alumina and titania, or industrial diamond, or non-electrically conductive carbon, or the like.

Drain connection 36 is formed by direct bonding copper onto dielectric layer 34. Dielectric layer 34 is formed on selected regions of baseplate 32 by carrying out the patterning and spraying process described above. Next, the direct bond copper layer is lithographically patterned and etched to form drain connections, such as drain connection 36 on the upper surface of baseplate 32. Although the direct bond copper layer is referred to as a drain connection in the present embodiment, those skilled in the art will appreciate that a variety of electrical contact features can be formed using the direct bonding and lithographic patterning process described herein.

Once the first direct bond copper layer is patterned, a plasma spraying process is again carried out to form the second dielectric layer on the upper surface of the direct bond copper. The second dielectric layer is formed in selected locations by using the patterning and spraying process described above. Next, a second layer of direct bond copper is applied to the surface of the first direct bond copper layer and bonded to the dielectric portions overlying the upper surface of the first direct bond copper layer. The second direct bond copper layer is patterned using a lithographic and etching process to form a variety of electrical interconnect structures, including electrical interconnects 50 and 52 illustrated in FIG. 6.

After processing the second direct bond copper layer to form electrical interconnects, electronic component 42 is bonded to the first direct bond copper layer that forms drain connection 36. Preferably, a solder bonding process is carried out to form bond 44 and attach electronic component 42 to drain contact 36. After completing the bonding process, electrical interconnects 50 and 52 are attached to electronic component 42 by means of contact bumps 54. Preferably, a suitable thermal bonding process is used to electrically connect interconnects 50 and 52 with contact bumps 54.

Those skilled in the art will recognize that a plurality of electronic components, such as electronic component 42, can be mounted on baseplate 32 and electrically coupled to various electronic circuitry using the first and second direct bond copper layers. The second direct bond copper layer can be connected to the first direct bond copper layer using a welding operation that forms a weld in an opening (not shown) in the dielectric layer. A similar process can be used to connect the first and second direct bond copper layers to the baseplate for grounding purposes.

In yet another embodiment, rather than forming foil tabs for attachment to the upper surface of the electronic component, the second direct bond copper layer can be patterned to form an interconnect layer overlying the second spray dielectric layer. Then, a conventional wire bonding process can be carried out to electrically couple the electronic component to the second direct bond copper layer. In a conventional wire bonding process, flat, bond pad contacts are employed on the upper surface of the electronic component, rather than the $C^4$ bumps illustrated in FIG. 6.

Importantly, the use of two direct bond copper layers permit overlying leads to be formed in an electronic module. One lead can function as the supply conductor, while the other lead functions as the return conductor. Because current is flowing in opposite directions, the associated magnetic fields from each lead will cancel each other out. The smaller magnetic fields can reduce the need for inductance control components, such as snubbing capacitors, and the like.

Figure 7:
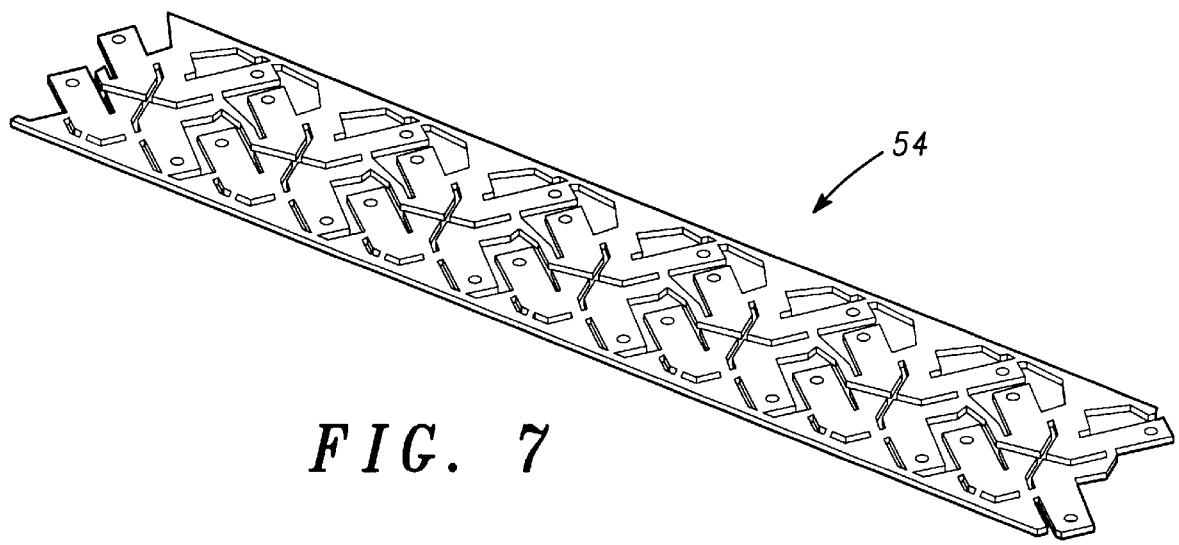
FIG. 7 illustrates a perspective view of a leadframe tape.

In another embodiment of the invention, the thermally conductive substrate is used in the fabrication of a packaged electronic device. The packaged electronic device includes a leadframe, rather than a baseplate. The leadframe can be formed through a progressive die process, as illustrated in FIG. 7. A leadframe tape 54 includes a number of individual leadframes sequentially stamped in leadframe tape 54. Leadframe tape is composed of a material, such as copper, a laminate of copper, invar, and copper, and a laminate of copper, molybdenum, and copper, and the like.

In the process of this embodiment, leadframe tape 54 is thermally sprayed with a dielectric coating, and a direct bond copper layer is attached to the dielectric coating using the direct bond copper process described above. The direct bond copper layer may be preformed in a stamping process so that when placed into the direct bond copper process, the copper layer already has a predefined configuration, or the foil may be patterned and etched after the direct bond copper process is completed. Electronic components are then attached to the leadframe and the direct bond copper layer.

Because the leadframe will form the terminals of the packaged electronic device, the electronic components can be attached directly to the leadframe. In the embodiments described above, the baseplate is held at ground potential because it serves as part of the electronic module. Because the baseplate is functioning as a part of the package connector in the present embodiment, the baseplate need not remain at ground potential. The direct bond copper layer can be used to connect the electrical components to the leadframe by using a welding operation that forms a weld in an opening in the dielectric layer.

Figure 8:
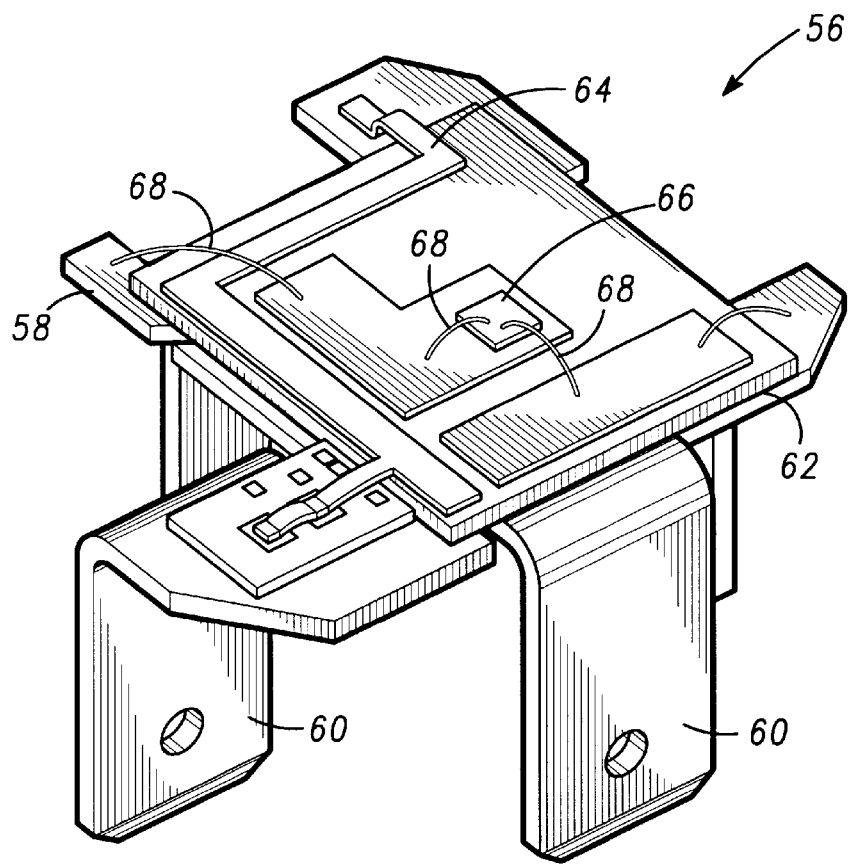
FIG. 8 illustrates a perspective view of a packaged electronic device formed in accordance with another embodiment of the invention prior to encapsulation.

A packaged electronic device 56, fabricated in accordance with the invention, at a stage prior to encapsulation is illustrated in FIG. 8. To fabricate device 56, a leadframe 58 is singulated from leadframe tape 54, and the leadframe 58 is formed to create a plurality of terminals 60. A section of patterned dielectric layer 62 overlies leadframe 58, and a patterned direct bond copper layer 64 overlies dielectric layer 62. An electronic component 66 is bonded to a portion of direct bond copper layer 64. A plurality of wire bonds 68 electrically connect bond pads (not shown) on electronic component 66 with direct bond copper layer 64 and leadframe 58.

Figure 9:
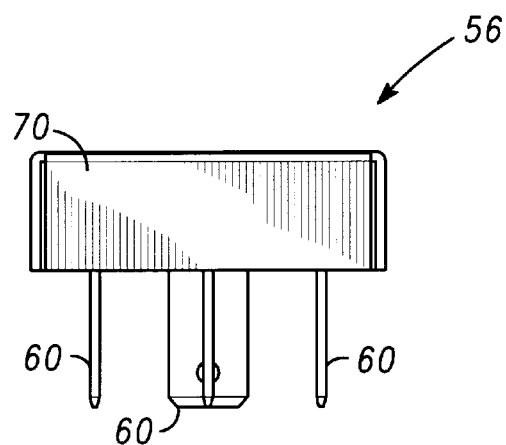
FIG. 9 illustrates a side elevation of the packaged electronic device shown in FIG. 8 after overmolding an encapsulant.

The fabrication of packaged electronic device 56 is completed, as illustrated in FIG. 9, by overmolding the structure shown in FIG. 8 with an encapsulant 70. The overmolding process forms a protective housing for electronic component 66, while leaving terminals 60 exposed for mounting packaged electronic device 56.

The "post forming" process of the present embodiment advantageously permits the processing of a flat part for ease of manufacturing, while also enabling the leadframe to serve as a connector. Post forming of the leadframe can also enable the device to be better integrated into the form factor of the electrical load that it controls. This device is cooled through the terminals and can be plugged into a standard relay box. Furthermore, the device's low profile permits a low profile relay box design.

Thus it is apparent that there has been disclosed, in accordance with the invention, a process for fabricating a thermally-conductive substrate and an electronic control module that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, a variety of lithographic and etching processes can be used to pattern the direct bond metal layers and the dielectric layers. It is therefore to include within the invention all such variations and modifications as fall within the scope of the appended claims and equivalents thereto.

What is claimed is:

1. A process for fabricating an electronic device having a thermally conductive substrate comprising the steps of:

providing a baseplate;

thermally spraying a dielectric layer onto the baseplate;

direct bonding an electrically conductive layer to the dielectric layer; and patterning the electrically conductive layer to form an interconnect pattern on the baseplate, heat generated by the electronic device is dissipated through the dielectric layer to the baseplate.

2. The process of claim 1, wherein the step of thermally spraying a dielectric layer comprises plasma spraying a dielectric layer selected from the group consisting of a metal oxide, a metal nitride, diamond, and non-electrically conductive carbon, and mixtures thereof.

3. The process of claim 1, further comprising forming a protective layer overlying the interconnect pattern.

4. The process of claim 1, further comprising separating the substrate into a plurality of substrates.

5. The process of claim 1, wherein the dielectric layer has a thickness of about 1 to about 20 mils.

6. The process of claim 2, wherein the step of plasma spraying comprises the step of roughening a surface of the substrate layer prior to plasma spraying the dielectric layer.

7. The process of claim 1, wherein the step of direct bonding an electrically conductive layer comprises direct bonding of copper.

8. The process of claim 1, wherein the step of providing a baseplate comprises providing a material selected from the group consisting of copper, a laminate of copper, a nickel-iron alloy, and copper, and a laminate of copper, molybdenum, and copper.

9. A process for fabricating an electronic device having a thermally conductive substrate comprising the steps of:

providing a baseplate;

providing a dielectric layer overlying the baseplate using a plasma spraying process;

forming a first metal layer overlying the dielectric layer using a direct bonding process; and patterning the first metal layer to form metal leads.

10. The process of claim 9, wherein the step of forming a first metal layer comprises direct bonding of copper.

11. The process of claim 9, wherein the step of providing a baseplate comprises providing a material selected from the group consisting of copper, a laminate of copper, a nickel-iron alloy, and copper, and a laminate of copper, molybdenum, and copper.

12. The process of claim 9, wherein the step of thermally spraying a dielectric layer comprises plasma spraying a dielectric layer selected from the group consisting of a metal oxide, a metal nitride, diamond, and non-electrically conductive carbon, and mixtures thereof.

13. The process of claim 9 further comprising the steps of:

populating the baseplate with electronic devices;

forming a second dielectric layer overlying the metal layer;

forming a second metal layer overlying the dielectric layer;

patterning the second metal layer; and attaching the second metal layer to the electronic devices located on the first baseplate.

14. The process of claim 13 further comprising applying an insulating compound to the first metal layer prior to attaching the second metal layer.

15. A process for fabricating a multi-chip module comprising the steps of:

providing a baseplate having a surface;

thermally spraying a first dielectric layer onto selected portions of the surface;

direct bonding a first metal layer to form an electrical contact layer;

patterning the first metal layer;

thermally spraying a second dielectric layer onto selected portions of the baseplate and the first metal layer;

direct bonding a second metal layer onto the second dielectric layer;

patterning the second metal layer to form a chip interconnect layer;

attaching at least one electronic device to the first metal layer; and electrically coupling the at least one electronic device to the chip-bonding layer.

16. The process of claim 15, wherein the step of thermally spraying a first dielectric layer onto selected portions of the surface further comprises a forming a pattern on the surface prior to thermally spraying the first dielectric layer.

17. The process of claim 17, wherein the step of attaching at least one electronic device to the chip-bonding layer comprises bonding a silicon electronic component to the chip-bonding layer, wherein the silicon electronic component includes chip contacts on an upper surface thereof.

18. The process of claim 17, wherein the step of patterning the second metal layer comprises forming extended foil tabs, and wherein the step of electrically coupling the at least one electronic device to the chip-bonding layer comprises attaching the extended foil tabs to the chip contacts.

19. The process of claim 17, wherein the step of bonding a silicon die to the chip-bonding layer comprises bonding a power device.

20. The process of claim 15, wherein the steps of direct bonding a first metal layer and direct bonding a second metal layer comprise direct bonding of copper.

21. A process for fabricating a packaged electronic device comprising the steps of:

providing a leadframe;

thermally spraying a dielectric layer onto the leadframe;

direct bonding an electrically conductive layer to the dielectric layer; and patterning the electrically conductive layer to form an interconnect pattern on the baseplate.

22. The process of claim 21, wherein the step of providing a leadframe comprises singulating the leadframe from a leadframe tape.

23. The process of claim 22, wherein the steps of thermally spraying a dielectric layer and direct bonding an electrically conductive layer are carried out prior to singulating the leadframe.

24. The process of claim 21, wherein the step of thermally spraying a dielectric layer comprises plasma spraying a dielectric layer selected from the group consisting of a metal oxide, a metal nitride, diamond, and non-electrically conductive carbon, and mixtures thereof.

25. The process of claim 21, wherein the dielectric layer has a thickness of about 1 to about 20 mils.

26. The process of claim 21, wherein the step of direct bonding an electrically conductive layer comprises direct bonding of copper.

27. The process of claim 1, wherein the step of providing a leadframe comprises providing a material selected from the group consisting of copper, a laminate of copper, a nickel-iron alloy, and copper, and a laminate of copper, molybdenum, and copper.

* * * * *